United States Patent
Lee et al.

(10) Patent No.: US 6,756,828 B2
(45) Date of Patent: *Jun. 29, 2004

(54) PHASE LOCK LOOP (PLL) APPARATUS AND METHOD

(75) Inventors: Kyeongho Lee, Seoul (KR); Deog-Kyoon Jeong, Seoul (KR)

(73) Assignee: GCT Semiconductor, Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/196,479

(22) Filed: Jul. 17, 2002

(65) Prior Publication Data

US 2002/0186063 A1 Dec. 12, 2002

Related U.S. Application Data

(63) Continuation of application No. 09/709,311, filed on Nov. 13, 2000, now Pat. No. 6,424,192, which is a continuation-in-part of application No. 09/121,863, filed on Jul. 24, 1998, now Pat. No. 6,194,947, and a continuation-in-part of application No. 09/121,601, filed on Jul. 24, 1998, now Pat. No. 6,335,952.

(60) Provisional application No. 60/164,874, filed on Nov. 12, 1999.

(51) Int. Cl.[7] .............................................. H03L 7/06
(52) U.S. Cl. ..................... 327/156; 327/158; 331/17; 331/40; 331/57
(58) Field of Search ............................. 327/156, 157, 327/158, 291, 295, 296, 299; 331/57, 17, 18, 19, 40, 42, 10

(56) References Cited

U.S. PATENT DOCUMENTS

| | | | |
|---|---|---|---|
| 4,731,590 A | 3/1988 | Saari | 330/278 |
| 4,755,774 A | 7/1988 | Heck | 332/18 |
| 5,012,142 A | 4/1991 | Sonntag | 327/158 |
| 5,175,729 A | 12/1992 | Borras et al. | 370/345 |
| 5,179,303 A | 1/1993 | Searles et al. | 327/277 |
| 5,180,994 A | 1/1993 | Martin et al. | 331/38 |
| 5,408,201 A | 4/1995 | Uriya | 331/2 |
| 5,418,815 A | 5/1995 | Ishikawa et al. | 375/216 |
| 5,438,591 A | 8/1995 | Oie et al. | 375/261 |
| 5,448,772 A | 9/1995 | Grandfield | 327/357 |
| 5,507,025 A | 4/1996 | Rodeffer | 455/266 |
| 5,555,182 A | 9/1996 | Galm | 702/69 |
| 5,584,062 A | 12/1996 | Meador et al. | 455/260 |
| 5,614,868 A | 3/1997 | Nielson | 331/1 A |
| 5,640,146 A | 6/1997 | Campana, Jr. | 455/54.1 |
| 5,734,970 A | 3/1998 | Saito | 455/76 |
| 5,761,617 A | 6/1998 | Yonekura et al. | 455/343 |
| 5,794,119 A | 8/1998 | Evans et al. | 455/71 |
| 5,861,773 A | 1/1999 | Meyer | 329/304 |
| 5,872,810 A | 2/1999 | Philips et al. | 375/222 |
| 5,878,087 A | 3/1999 | Ichihara | 375/316 |
| 5,880,613 A | 3/1999 | Ishihara | 327/202 |
| 5,889,437 A | 3/1999 | Lee | 331/16 |
| 5,894,592 A | 4/1999 | Brueske et al. | 455/86 |
| 5,950,119 A | 9/1999 | McGeehan et al. | 455/302 |
| 5,963,855 A | 10/1999 | Lussenhop et al. | 455/226.2 |
| 6,029,059 A | 2/2000 | Bojer | 327/361 |
| 6,084,905 A | 7/2000 | Ishifuji et al. | 375/202 |
| 6,097,768 A | 8/2000 | Janesch et al. | 375/330 |
| 6,169,452 B1 | 1/2001 | Popescu et al. | 330/254 |
| 6,175,279 B1 | 1/2001 | Ciccarelli et al. | 330/296 |
| 6,194,947 B1 | 2/2001 | Lee et al. | 327/359 |

Primary Examiner—Timothy P. Callahan
Assistant Examiner—An T. Luu
(74) Attorney, Agent, or Firm—Fleshner & Kim, LLP

(57) ABSTRACT

A phase lock loop (PLL) and methods for using same is provided that includes a multiple-feedback CMOS voltage control oscillator (VCO) and multi-phase sampling fractional-N prescaler. The PLL provides increased performance characteristics for a single chip CMOS radio frequency (RF) communications system. The multiple feedback CMOS VCO maintains an amplitude of a VCO signal while reducing a rise/fall time of the VCO signal. The multiple feedback CMOS VCO further reduces supply noise effects. The multi-phase sampling fractional-N prescaler provides sufficient bandwidth for a CMOS VCO while maintaining spectral purity and reducing fractional-spur. The multi-phase sampling fractional-N prescaler can include a divider, a sampler circuit, a selector circuit and a modular counter.

23 Claims, 6 Drawing Sheets

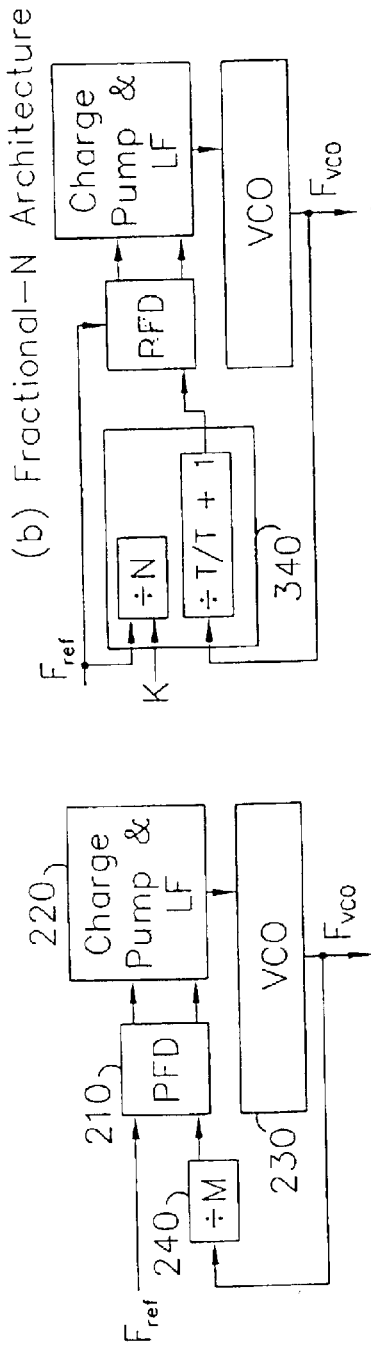

(b) Fractional-N Architecture $F_{vco} = (T + \frac{K}{N}) \cdot F_{ref} = (T + \frac{K}{N}) \cdot N \cdot BW$ Comparison Interval $= \frac{1}{F_{ref}} = \frac{1}{N \cdot BW_{channel}}$ Phase Noise $\propto 20 \log(T + \frac{K}{N})$ $\propto \frac{1}{\text{PLL Bandwidth}}$

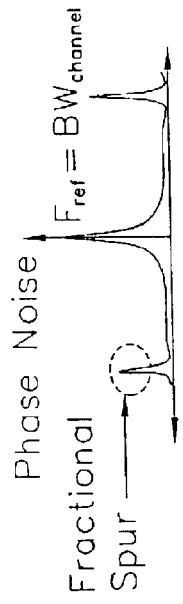

FIG. 3

$F_{vco} = M \cdot F_{ref} = M \cdot BW_{channel}$

Comparison Interval $= \frac{1}{F_{ref}} = \frac{1}{BW_{channel}}$

Phase Noise $\propto 20 \log M$ $\propto \frac{1}{\text{PLL Bandwidth}}$

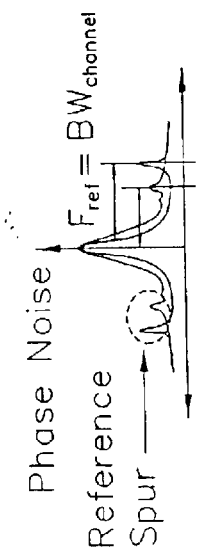

FIG. 2

PHASE LOCK LOOP (PLL) APPARATUS AND METHOD

This application is a continuation of application Ser. No. 09/709,311 filed Nov. 13, 2000 (U.S. Pat. No. 6,424,192) which is a continuation-in-part of application Ser. Nos. 09/121,863 filed Jul. 24, 1998 (U.S. Pat. No. 6,194,947) and 09/121,601 filed Jul. 24, 1998 (U.S. Pat. No. 6,335,952) and claims priority to Provisional Application No. 60/164,874 filed Nov. 12, 1999, the contents of which are incorporated by reference.

BACKGROUND OF THE INVENTION

1. Field of the Invention

The present invention relates to a radio frequency (RF) communications system, and in particular to a phase lock loop (PLL) including a multi-phase sampling fractional-N prescaler and CMOS voltage controlled oscillator for the PLL.

2. Background of the Related Art

Presently, a radio frequency (RF) communication system has a variety of applications including PCS communication, IMT systems such as IMT 2000, and WLL. As such, a single chip CMOS integration of the system has been pursued to reduce the cost, size and power consumption. Accordingly, a low phase noise integrated voltage controlled oscillator (VCO) for RF communication applications has been broadly researched. However, current VCO CMOS technology can support reliable operation only up to a frequency of approximately 1.0 GHz in terms of speed and noise. As the frequency $f_0$ of local oscillator clock signals LO+ LO− increases over one GHz, a CMOS VCO cannot be implemented.

To get the low phase noise sufficient for commercial applications such as PCS, however, an LC-resonant oscillator is used because of better phase noise performance than a CMOS ring-oscillator type VCO. As described above, the related art VCO has various disadvantages. For a CMOS single chip integration of an RF receiver or communication system, on-chip implementation of a spiral inductor has not been achieved with yields sufficient for mass-production manufacturing because the Q-factor of the integrated spiral inductor should be high enough for VCO oscillation. Manufacturing yield for the high Q-factor is difficult to achieve for the on-chip spiral inductor because of distributed lossy resistance of the substrate.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

A further object of the present invention is to fabricate a RF communications system including a PLL on a single CMOS chip.

Another object of the present invention is to increase the frequency range of a PLL.

Another object of the present invention is to reduce the noise of a PLL.

Another object of the present invention is to increase the performance of PLL.

Another object of the present invention is to provide a CMOS VCO for a PLL that can minimize phase-noise of a CMOS ring oscillator.

Another object of the present invention is provide a VCO that can output a large amplitude signal with a rise-fall time reduced or minimized.

Another object of the present invention is to reduce or minimize supplying noise effects of the VCO.

Another object of the present invention is to provide a prescaler for the PLL having increased bandwidth and spectral performance.

Another object of the present invention is to provide a fractional-N prescaler architecture that eliminates a fractional-spur problem.

To achieve the above advantages in a whole or in parts and in accordance with the purpose of the present invention, as embodied and broadly described, there is provided a circuit that includes a clock generator that generates a plurality of first clock signals having different phases, each first clock signal having a first frequency that is less than a reference frequency and a prescaler coupled to said clock generator for receiving the plurality of first clock signals to generate a divided clock second clock signal.

To further achieve the above advantages in a whole or in parts, there is provided a prescaler that includes a divider circuit coupled to receive one of a plurality of first clock signals, a sampler circuit that receives an output signal of the divider circuit and the plurality of first signals, wherein the sampler circuit outputs a plurality of second clock signals, a selector coupled to receive the second plurality of clock signals and a selection signal, wherein the selector outputs a divided clock signal, and a logic circuit coupled between the divider circuit and the selector to output the selection signal.

To further achieve the above advantages in a whole or in parts, there is provided a method that includes outputting a plurality of clock signals, wherein each of the plurality of clock signals have the same period, and wherein at least two of the plurality of clock signals are out of phase, inputting the plurality of clock signals into a prescaler, and generating a divided clock signal having a higher frequency than the plurality of clock signals.

To further achieve the above advantages in a whole or in parts, there is provided an apparatus that includes an oscillator, wherein the oscillator comprises a plurality of delay cells configured to output a plurality of signals at the same frequency having different phases, and device for outputting a signal having a different frequency than the oscillator.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 2 is a diagram that illustrates a related art integer-N architecture;

FIG. 3 is a diagram that illustrates a related art fractional-N prescaler;

DETAILED DESCRIPTION OF PREFERRED EMBODIMENTS

Figure 1:
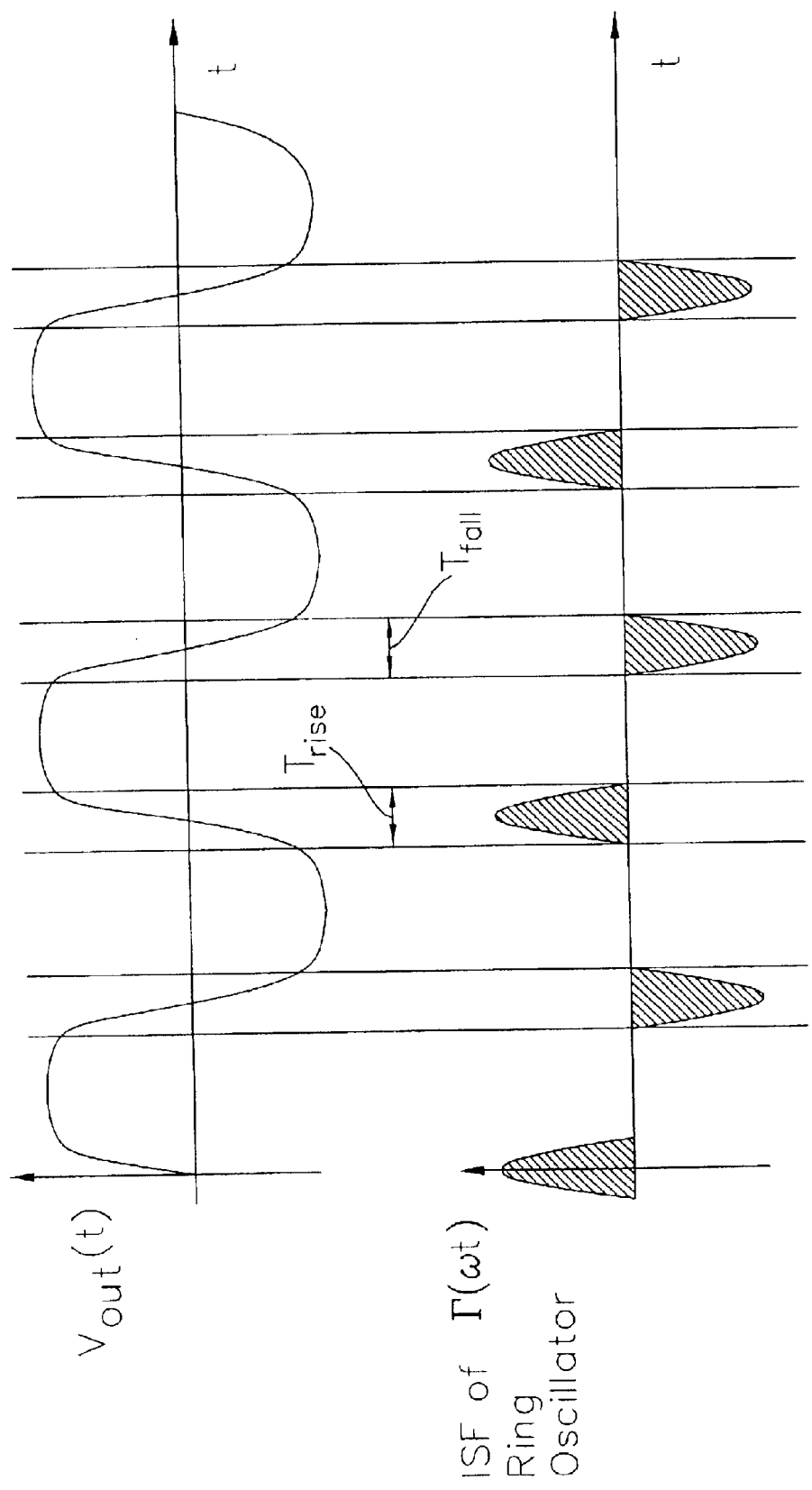
FIG. 1 is a diagram that illustrates impulse sensitivity function for a CMOS ring oscillator according to the related art.

The method for analyzing phase noise of a CMOS ring oscillator can use equation 1 (Lesson's Equation) as follows:

$$PhaseNoise(\Delta\tilde{\omega}) = 10 \cdot \left\{ \frac{2FkT}{P_{sig}} \left[ 1 + \left( \frac{\tilde{\omega}_0}{2Q\Delta\tilde{\omega}} \right)^2 \right] \cdot \left( 1 + \frac{\Delta\tilde{\omega}1/f^3}{|\Delta\tilde{\omega}|} \right) \right\} \quad (1)$$

According to equation 1, the phase noise ($\Delta\omega$) curve of phase noise plotted against frequency offset (log $\Delta\omega$) is composed of three different slope sections. At sufficiently small frequency offset from the carrier frequency ($f_0$), there is a first section that is proportional to $(1/\Delta\omega)^3$. The first section is generated by 1/f noise of the device. After the first section $(1/\Delta\omega)^3$, there is a second section having a curve that is proportional to $(1/\Delta\omega)^2$. Further, the phase noise spectra eventually flatten out for large frequency offsets in a third section, rather than continuing to drop as the square of the phase noise $\Delta\omega$. Such a noise floor may be due to the noise associated with any active elements (such as buffers) placed between VCO and the measuring equipments, or it can even reflect limitations in the measuring equipment itself. The factor F is empirical and varies significantly from oscillator to oscillator. The value of F therefore must be determined from measurements. According to equation 1, increasing a Q-factor, increasing a signal amplitude or decreasing a center frequency are ways to reduce phase noise.

Another model for VCO phase noise analysis (Hajimiri) asserts that the phase displacement of an oscillator signal depends on when the impulse noise is applied. Thus, the phase noise analysis is time varying, and the shortcoming of the linear time-invariant noise analysis such as equation 1 (Lesson's equation) become apparent. To the extent that linearity remains a good assumption, the amount of phase displacement is proportional to magnitude of the noise impulse, and varies inversely with a total signal charge. Hence, the impulse response for the phase displacement may be shown at equation 2 as:

$$h\phi(t, \tau) = \frac{\Gamma(\tilde{\omega}_0)}{q_{max}} u(t - \tau) \quad (2)$$

where $q_{max}$ is the maximum charge displacement for the signal, u(t) is the unit step, a function $\Gamma(x)$ is the impulse sensitivity function (ISF), which is a dimensionless, frequency-and amplitude-independent function that is periodic in $2\pi$. The ISF encodes information about the sensitivity of the system to an impulse injected at phase $\omega_0\tau$. The ISF varies from oscillator to oscillator. Once the ISF has been determined (by standard methods), the excess phase can be determined through use of the superposition integral under the assumption of linearity as shown at equation (3) as:

$$\Phi(t) = \int_{-\infty}^{\infty} h\phi(t, \tau)i(\tau)d\tau = \frac{1}{q_{max}} \int_{-\infty}^{t} \Gamma(\tilde{\omega}_0\tau)i(\tau)d\tau \quad (3)$$

FIG. 1 is a diagram that shows the shape of ISF of a related art CMOS ring oscillator. As shown in FIG. 1, the absolute value of ISF function according to equation (3) has its maximum value during the transitions. In other words, noise impulse caused by device noise current affects the phase displacement on the transition region. Thus, to reduce or minimize the phase noise of CMOS ring oscillator, rise/fall time ($T_{rise}$, $T_{fall}$) should be reduced or minimized.

In addition, supply noise effects the phase noise of the CMOS VCO. The supply fluctuation can induce the abrupt phase displacement on CMOS ring oscillator, which results in the increment of phase noise. To reduce the supply noise effects on CMOS VCO, adding a source follower on the top of the VCO circuit can be used to achieve supply noise rejection. By using the source follower, the frequency of VCO can be controlled with the power supply noise effects reduced or minimized. The power supply is connected to a drain electrode of the source follower so that high impedance is seen from the power node. A source electrode of the source follower becomes an actual supply node of VCO, which is hardly affected by real power supply fluctuation.

To support commercial RF standards, such as PCS, WLL, and IMT2000, a prescaler should be added to the PLL to provide (a) large bandwidth to overcome large phase noise of CMOS ring oscillator and (b) relatively small channel spacing to meet the standards. However, supporting the large bandwidth and supporting the small channel spacing are trade-offs with each other (i.e., conflicting requirements) because both the PLL bandwidth and the channel spacing are proportional to the reference frequency applied to a phase detector. That is, relatively low VCO phase noise can be achieved for a large channel spacing.

An integer-N prescaler and a fractional-N prescaler are two generally used related art prescaler architectures as shown in FIGS. 2 and 3, respectively. As shown in FIG. 2, a PLL architecture including the related art integer-N prescaler includes a phase frequency detector 210, a charge pump and loop filter 220 that outputs a frequency control signal to a VCO 230. The phase frequency detector 210 receives a reference clock signal Fref and a VCO clock signal Fvco from a VCO clock divider circuit 240, respectively. The frequency $f_0$ of local oscillator clock signals from the VCO is represented by (Fref)=$f_0$. Thus, the frequency Fvco is based on the reference clock signal Fref and the circuit 240 in FIG. 2, and the frequency of the Fvco is determined by a reference clock frequency Fref.

For example, the related art integer-N architecture for PCS system as shown in FIG. 2, the reference frequency (Fref) applied to the phase detector should be the same as channel spacing (BWchannel), which is about 600 KHz. Thus, the bandwidth of PLL using integer-N architecture is fixed to channel spacing, and the bandwidth sufficient to overcome large phase noise of CMOS ring oscillator is hard to get by using integer-N architecture. Another problem of the integer-N architecture is the reference spur problem. Whenever the phase detector 210 compares the reference frequency Fref and the VCO 230 frequency Fvco, the charge-pump 220 provides charge for the loop filter, which corresponds to a phase error between the reference and VCO clock. The charge pumping mechanism whose frequency is equal to channel spacing induces a spurious spectral spur called the reference spur, which has a frequency equal to the channel spacing. The reference spur can cause severe problems on frequency conversion flow of an RF transmitter TX and an RF receiver RX because the spur frequency is located within the in-band region.

In the related art fractional-N architecture 340 as shown in FIG. 3, the reference frequency (Fref) can be increased regardless of the channel spacing ($BW_{channel}$) so that sufficient bandwidth can be obtained to overcome the large phase noise of CMOS ring oscillator. As shown in FIG. 3, Fref is equal to $N \times BW_{channel}$. By increasing N, the reference frequency Fref increases, which results in large bandwidth. However, the fractional spur problem exists in the related art fractional-N architecture 340 because the fractional spur whose frequency is equal to the channel spacing can cause a similar problem as that of reference spur in integer-N architecture. Further, the amount of the fractional spur is much larger than the amount of the reference spur of the related art integer-N architecture shown in FIG. 2. Accordingly, the related art PLL architecture adaptable for a CMOS RF communication system cannot overcome both of bandwidth and spur problems.

Preferred embodiments of a CMOS PLL adaptable for an RF communications system includes preferred embodiments of a multi-phased sampling fractional-N prescaler and VCO and methods of using same will now be described.

Figure 4:
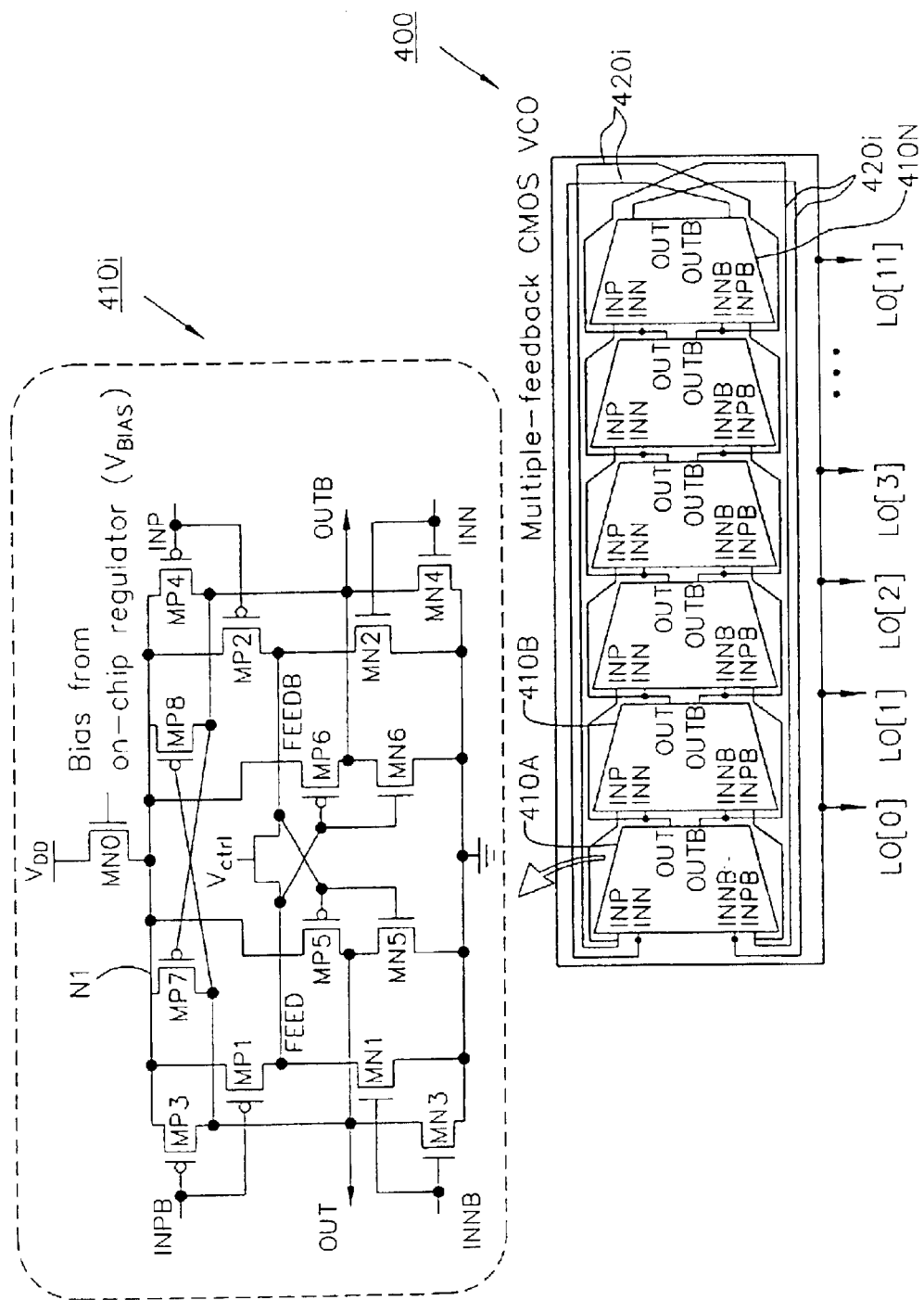
FIG. 4 is a diagram that illustrates a CMOS VCO according to a preferred embodiment.

FIG. 4 is a diagram that illustrates a preferred embodiment of a CMOS VCO according to the present invention. According to the preferred embodiment of a CMOS VCO, a multiple-feedback CMOS VCO 400 includes multiple feedback loops 420, for low phase noise. As shown in FIG. 4, the CMOS VCO includes a plurality of serially coupled delay cells 410A, 410B, . . . , 410N that output a plurality of N-phase clock signals LO[0:N−1]. The VCO 400 has multiple feedback loops to increase the VCO frequency and reduce rise-fall times of the local oscillator LO waveforms. As shown in FIG. 4, a VCO cell $410_i$ (i=1−N) has four input ports (INP, INN, INNB, INPB) and two output ports (OUT, OUTB). The output terminal OUT (cell $410_i$) coupled to an input terminal INNB (cell $410_{i+1}$) and an input terminal INPB (cell $410_{i+2}$). An output signal OUT (cell $410_i$) and is coupled to an input terminal INN (cell $410_{i+1}$) and input terminal INP (cell $410_{i+2}$). However, output signals OUT, OUTB from cell 410(N−1) are respectively fed back to input terminals INPB, INP of cell 410(0), respectively and output signals OUT, OUTB from cell 400(N) are fed back to input terminals of INNB, INN of cell 400(0), respectively.

A preferred embodiment of a delay cell $410_i$ of the VCO 400 will now be described. As shown in FIG. 4, each delay cell $410_i$ includes four input terminals INP, INPB, INN, INNB, two output terminals OUT, OUTB and is coupled between a power source voltage $V_{DD}$ and a ground voltage and in addition receives a control voltage Vctrl. As shown in FIG. 4, the cell $410_i$ includes a first NMOS transistor MN0 coupled between the power supply voltage $V_{DD}$ and a first node N1. A gate electrode of the NMOS transistor MN0 receives a bias voltage $V_{BIAS}$ from preferably an on-chip regulator. Each cell $410_i$ further includes pairs of transistors including MP3-MN3, MP1-MN1, MP5-MN5, MP6-MN6, MP2-MN2, and MP4-MN4 coupled between the first node N1 and the ground voltage. Further, the input terminal INP is coupled to a gate electrode of the transistors MP4 and MP2, an input terminal INN is coupled to gate electrodes of the transistors MN4, MN2, the input terminal INPB is coupled to gate electrodes of the transistors MP3, MP1 and the input terminal INNB is coupled to gate electrodes of the transistors MN3, MN1. The output terminal OUT of the cell $400_i$ is coupled at a junction between drain electrodes of the transistor pair MP3-MN3 and drain electrodes of the transistor pair MP5-MN5. The output terminal OUTB is connected to the interconnection between drain electrodes of the transistor pair MP4-MN4 and drain electrodes of the transistor pair MP6-MN6. A transistor MN7 receives the control voltage Vctrl at a gate electrode, and is coupled between nodes FEED and FEEDB, respectively. Coupled drain electrodes of the transistor pair MP1-MN1 and gate electrodes of the transistor pair MP6-MN6 are also coupled to the node FEED. Coupled drain electrodes of the transistor pair MP2-MN2 and gate electrodes of the transistor pair MP5-MN5 are coupled to the node FEEDB. Further, a transistor MP7 has a source electrode coupled to the first node N1, a drain electrode coupled to the output terminal OUT and a gate electrode coupled to the output terminal OUTB. A transistor MP8 has a source electrode coupled to the first node N1, a drain electrode coupled to the output terminal OUTB and a gate electrode coupled to the output terminal OUT.

Operations of the cell $410_i$ according to the preferred embodiment of the multiple-feedback CMOS VCO 400 will now be described. In the cell $410_i$, the transistor MN0 prevents noise injection caused by the supply fluctuation. Preferably, the transistor MN0 has a high impedance at the power supply voltage $V_{DD}$ side and a low impedance the first at node N1. Accordingly, effects of the supply fluctuation are reduced on the VCO operations. An inverter structure composed of the transistor pair MP3-MN3 and the transistor pair MP4-MN4 receive the signals INPB, INNB, INP, and INN, respectively, from a previous cell 410(i−1) and generates the output signals OUT, OUTB at commonly coupled drain electrodes. The transistors MP7 and MP8 construct a positive feedback network or loop to supplement or improve the VCO 400 oscillation and reduce rise/fall times. A second positive feedback network is preferably composed of four inverters, inverter1 (the transistor pair MP1-MN1), inverter2 (the transistor pair MP5-MN5), inverter3 (the transistor pair MP2-MN2) and inverter4 (the transistor pair MP6-MN6) to control the frequency of the VCO 400 by changing a gate voltage Vctrl of the transistor MN7. When the control voltage Vctrl decreases, the output node FEED of the inverter1 and the output node FEEDB of the inverter3 become isolated. As a result, the signals at the output nodes FEED and FEEDB can operate in an inverted manner, which results in the inverter1 and the inverter3 providing positive feedback on the signal operation of the output terminal OUTB and the inverter2 and the inverter4 providing positive feedback on the signal operation of the output terminal OUT. In this case, the rise/fall time of the waveform on the output terminals OUT, OUTB is minimized but the VCO frequency becomes reduced because the strong positive feedback prohibits the VCO 400 signal from quickly changing the state of the VCO 400 signal. In other words, a time delay is generated for the VCO 400 signal to change signal state and propagate. When the control voltage Vctrl increases, conductivity of the transistor MN7 increases to prevent the signals of the output nodes FEED and FEEDB from operating in the inverted manner. In other words, amplitude of the signals of the output nodes FEED and FEEDB are reduced by the increased conductivity of the transistor MN7. As a result, the positive feedback strength on the output terminal OUTB by the inverter1 and the inverter2 is reduced or weak, which results in a rapid state change of the VCO 400 signal and an increment in the VCO 400 frequency. In other words, the weak positive feedback helps the VCO 400 signal to change its state quickly and with reduced resistance, which results in a frequency increment.

Accordingly, the preferred embodiment of the CMOS VCO 400 in a PLL minimizes phase-noise of a CMOS ring oscillator by increasing an amplitude of the VCO signal, minimizing or reducing rise/fall time of the VCO signal and reducing or minimizing supply fluctuation noise effects on a VCO. As shown in FIG. 4, transistors MN0–MN7 are preferably NMOS type transistors, and the transistors MP1–MP8 are preferably PMOS type transistors. However, the present invention is not intended to be so limited.

As described above, the preferred embodiments of the CMOS VCO and methods for operating same have various advantages. The preferred embodiments of the CMOS VCO have a symmetric PMOS/NMOS structure to match the rise/fall time of the local oscillator LO waveforms, which can reduce the phase noise caused by rise/fall time mismatch. Further, a frequency of the VCO according to the preferred embodiments can be controlled by adjusting the strength of the feedback network. The preferred embodiments use a simple control structure for the feedback networks. In particular, as a control signal value (e.g., Vctrl) decreases, the amount of feedback by the feedback networks increases. In the preferred embodiment of the VCO 400, as Vctrl decreases, the voltage level of the output nodes FEED and FEEDB increase and the amount of feedback by the feedback network increases. Thus, a rapid or sharp rise/fall time for a VCO can be maintained by the preferred embodiments even at a reduced frequency. Thus, the preferred embodiments of the CMOS VCO and methods using the same provides a full swing LO signal with fast rise/fall time and high power supply rejection ratio (PSRR).

Figure 5:
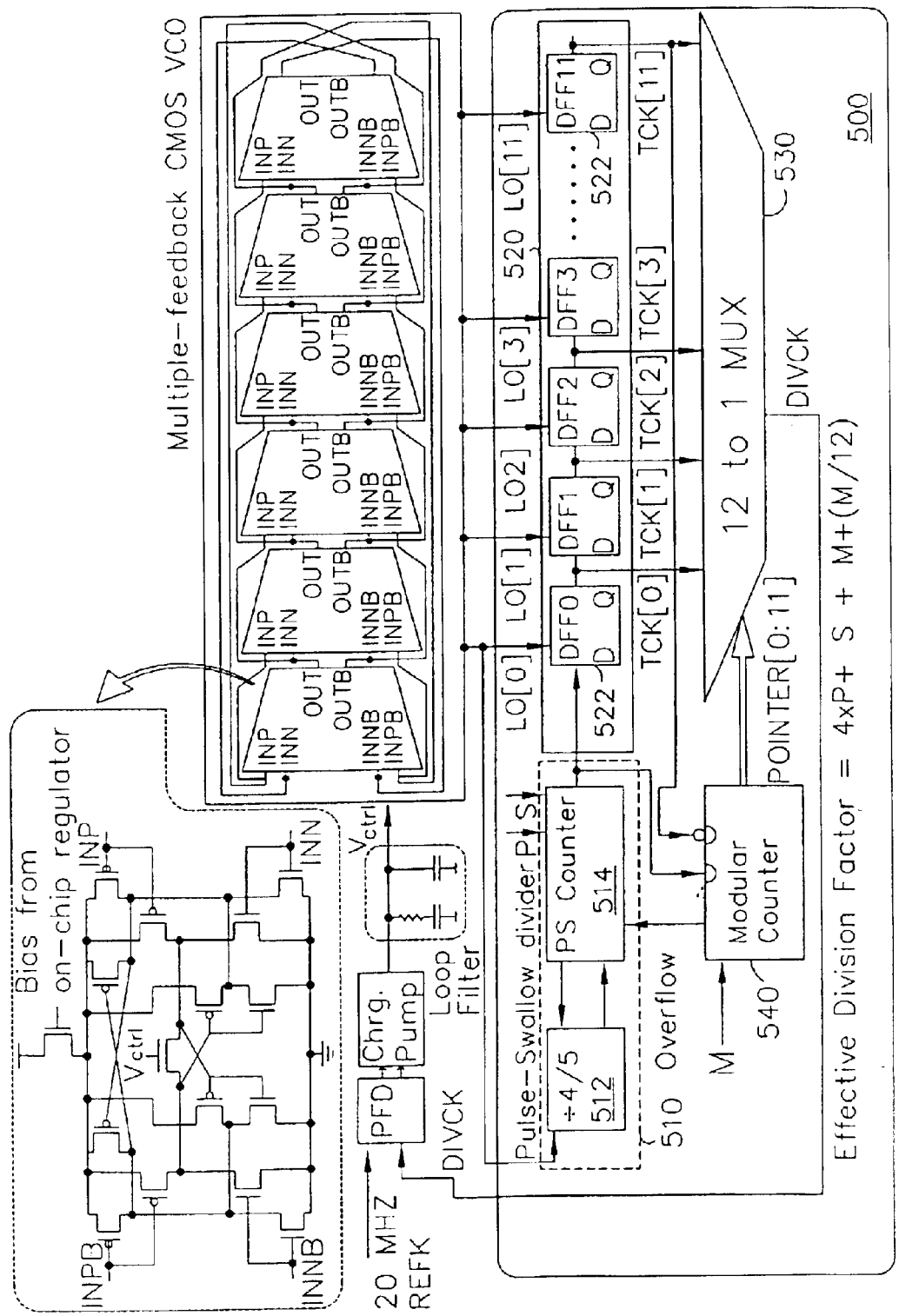
FIG. 5 is a diagram that illustrates a preferred embodiment of a fractional-N prescaler according to the present invention.

FIG. 5 is a diagram that illustrates a phase lock loop according to a second preferred embodiment of the present invention. As shown in FIG. 5, a second preferred embodiment of the PLL includes a CMOS VCO 400 and a multi-phase sampling fractional-N prescaler 500 includes a pulse-swallow divider 510, a multi-stage (e.g., 12-stage) multi-phase sampler 520, a multiplexer 530 (e.g., 12 to 1 multiplexer) and a modular counter 540.

The pulse-swallow divider 510 preferably performs divide-by-[4×P+S] operations. The pulse-swallow divider 510 includes a divider 512 and a counter 514. In the related art, the LO frequency is too high for robust logic operation such as selecting one phase signal among multi-phase signals using a selection operation such as a multiplexer operation. Thus, before selecting one phase signal among multi-phase clocks, division by the pulse-swallow divider 510 is performed to decrease the frequency to provide more robust logic operations.

The output of the pulse-swallow divider 510 is sampled by the multi-phase sampler 520 that preferably includes a plurality of N flip flops 522 coupled in series. As shown in FIG. 5, the multi-phase sampler 520 samples using 12-phase 800 MHz LO clocks (LO[0:11]). The outputs of the 12-stage sampler 520 (TCK[0:11]) have 12 different timings determined by the 12-phase LO clocks. A timing difference between the adjacent TCK clock signals are $(1+1/12) \times T_{vco}$, where $T_{vco}$ is the period of LO clocks coming from the VCO 400. For example, as shown in FIG. 5, the number of multi-phase clock signals LO is 12, the frequency of LO clocks is 800 MHz, $T_{vco}$ is 1.25 ns and the timing difference between the adjacent TCK clock is $(1+1/12) \times 1.25$ ns. The reason that the timing difference is not $1/12 \times T_{vco}$ but $(1+1/12) \times T_{vco}$ is that the setup and hold time window of the 12-stage sampler 520 is larger than $1/12 \times T_{vco}$ and smaller than $(1+1/12) \times T_{vco}$. The modular counter 520 periodically selects one of TCK[0:11] according to an input control signal M, which ranges from 0 to 11. The resultant period of the 12-to-1 multiplexer 530 output DIVCK is $[4 \times P+S+M+M/12] \times T_{vco}$. Thus, the resultant division ratio of the first preferred embodiment of the prescaler 500 is $[4 \times P+S+M+M/12]$.

As described above, the fractional spur of the related fractional-N prescaler is caused by clocking frequency of the prescaler, which is equal to the channel spacing. The preferred embodiment of the prescaler 500 does not use a timing source whose frequency is equal to channel spacing. As a result, the prescaler 500, with a fractional-12 operation (e.g., N=12), increases the PLL bandwidth and reduces the phase noise without the fractional spur. In particular, the fractional spur frequency of the prescaler 500 is equal to the reference clock frequency (e.g., 800 MHz) and is far from the channel spacing. By changing the P, S, and M values, the PLL including the VCO 400 and the prescaler 500, can support different channel frequencies.

Figure 6:
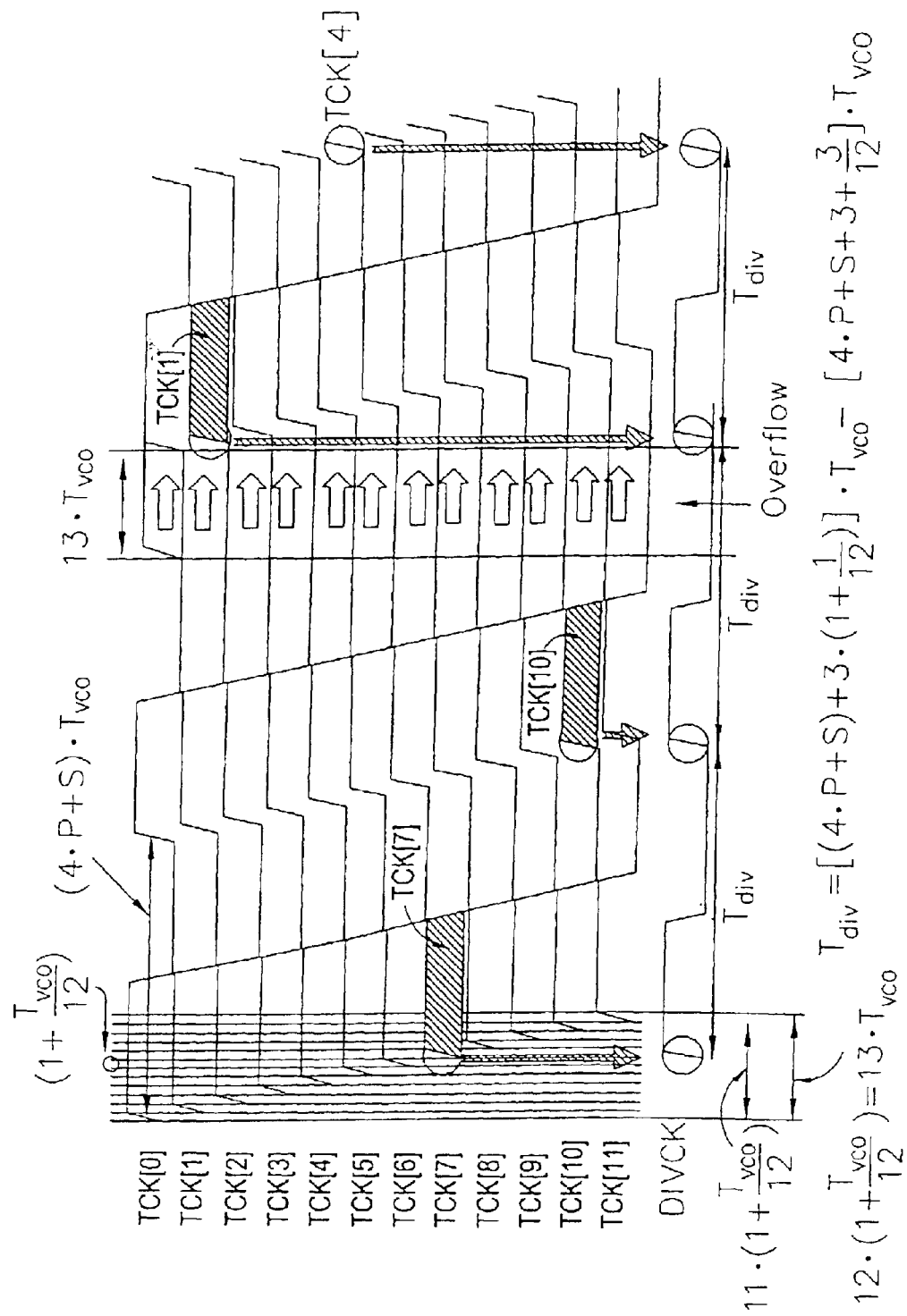
FIG. 6 is a diagram that illustrates operational and timing waveforms according to a preferred embodiment of a fractional-N prescaler.

Operations of the preferred embodiment of the multi-phase sampling fractional-N prescaler 500 will now be described. FIG. 6 is a diagram that shows operation and timing waveforms of the prescaler 500 when M=3. The period of TCK[0:11] is $(4 \times P+S) \times T_{vco}$. As shown in FIG. 6, TCK[7] is initially selected as the DIVCK. At this time, POINT[0:11] is 000000010000. After a first cycle, the modular counter 530 shifts the POINT[0:11] value by 3, which results in POINT[0:11] is 000000000010. Thus, TCK[10] is selected as DIVCK for a second cycle. After the second cycle, POINT[0:11] becomes 010000000000. In a third cycle, TCK[1] is selected. However, in the third cycle shown in FIG. 6, a control signal OVERFLOW, which means that pointer value is smaller than that of the previous cycle (e.g., 1<10), is detected by the modular counter 530. The modular counter 530 asserts the OVERFLOW signal and controls the PS-Counter 514 to increase its division factor by $13 \times T_{vco}$ to maintain the exact timing as shown in FIG. 6. As a result, the period of DIVCK, which is applied as one phase detector PFD input, becomes $[4 \times P+S+3 \times (1+1/12)] \times T_{vco}$ as shown in FIG. 6. The other phase detector PFD input is a reference frequency, e.g., 20 MHz REFK. Thus, the effective division factor of the prescaler 500 as shown in FIG. 6 is $[4 \times P+S+3 \times (1+1/12)]$.

Figure 7:
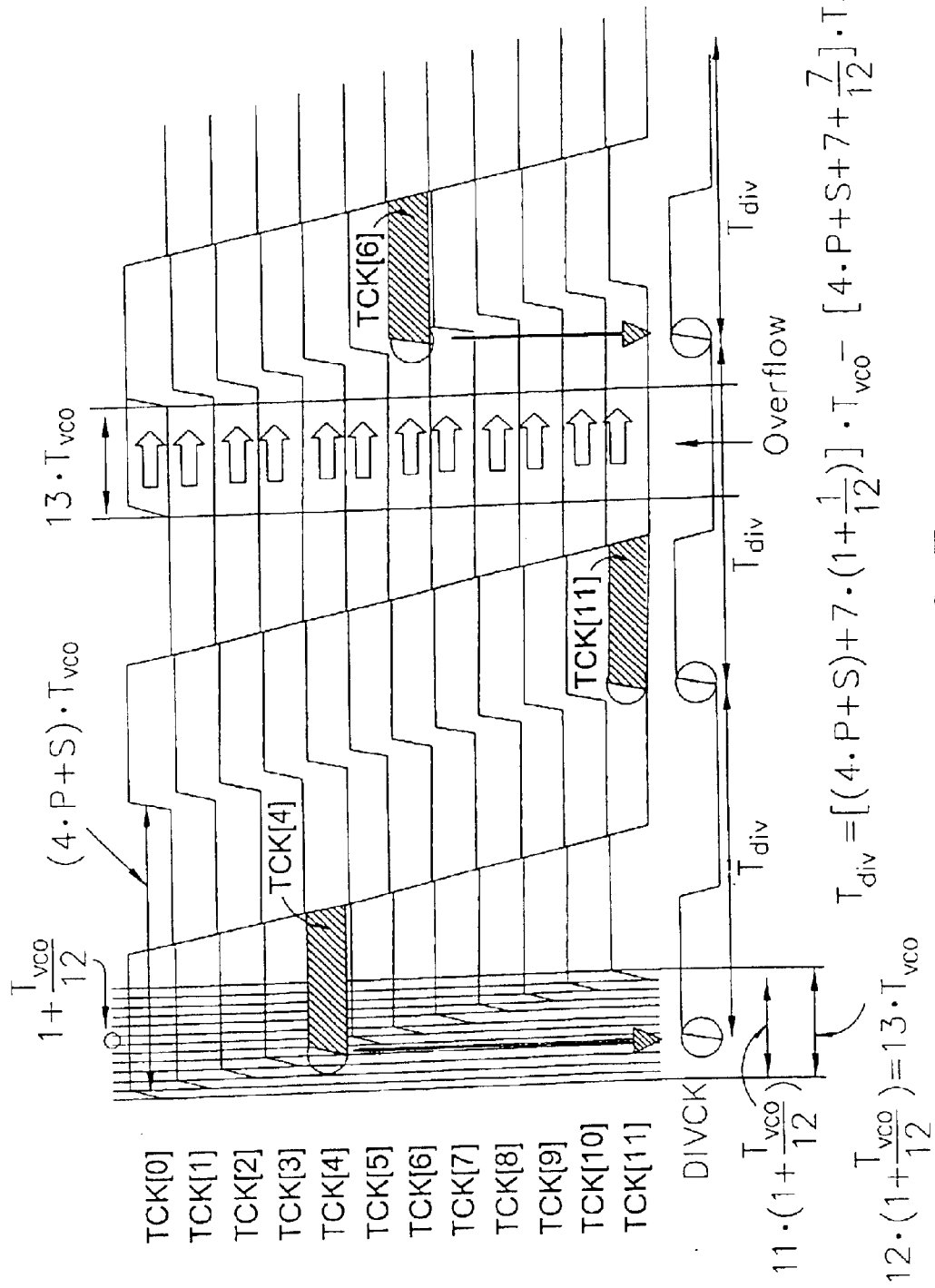
FIG. 7 is a diagram that illustrates operational and timing waveforms according to a preferred embodiment of a fractional-N prescaler.

FIG. 7 is a diagram that shows operation and timing waveforms of the prescaler 500 when M=7. The period of TCK[0:11] is $(4 \times P+S) \times T_{vco}$. Initially, TCK[4] is selected as the DIVCK as shown in FIG. 7. At this time, POINT[0:11] is 000010000000. After a first cycle, the modular counter 530 shifts the POINT[0:11] value by 7, which results in POINT[0:11] is 000000000001. Thus, TCK[11] is selected as the DIVCK. After a second cycle, POINT[0:11] becomes 000000100000. In a third cycle, TCK[6] is selected. But in the third cycle, the control signal OVERFLOW, which means that pointer value is smaller than that of the previous cycle (e.g., 6<11), is detected by the modular counter 530. The modular counter 530 applies the OVERFLOW signal and makes the PS-Counter 514 increase its division factor by $13 \times T_{vco}$ to maintain the exact timing as shown in FIG. 7. As a result, the period of DIVCK, which is applied as one of the phase detector PFD inputs, becomes $[4 \times P+S+7 \times (1+1/12)] \times T_{vc}$. Thus, the effective division factor of the prescaler 500 as shown in FIG. 7 is $[4 \times P+S+7 \times (1+1/12)]$.

As described above, preferred embodiments of a prescaler 500 have various advantages. The preferred embodiments of a PLL including a multi-phase fractional-N prescaler and methods of using same provide large bandwidth and spectral purity. Further, according to the preferred embodiments, the prescaler reduces or eliminates a fractional-spur problem. Accordingly, a PLL incorporating the preferred embodiments of the VCO and prescaler architecture and methods for using same increase performance characteristics for an RF CMOS single-chip communication system.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A circuit, comprising:
    a clock generator that generates a plurality of first clock signals having different phases, each first clock signal having a first frequency that is less than a reference frequency; and
    a prescaler coupled to the clock generator that receives the plurality of first clock signals to generate a second clock signal based on the reference frequency that is higher than the first frequency.

2. The circuit of claim 1, wherein the clock generator includes a plurality of delay cells coupled in series for providing the plurality of first clock signals having different phases, wherein a first one of the plurality of delay cells receive feedback signals from subsequent ones of the delay cells.

3. The circuit of claim 2, wherein each of the delay cells includes first and second output terminals and first through fourth input terminals.

4. The circuit of claim 1, wherein the clock generator is a voltage controlled oscillator (VCO), and the second clock signal is a divided clock signal.

5. The circuit of claim 1, wherein the circuit is a CMOS circuit formed on a single chip.

6. The circuit of claim 1, wherein the prescaler comprises:
    a divider circuit coupled to receive one of the plurality of first clock signals;
    a sampler circuit that receives an output signal of the divider circuit and at least two of the plurality of first signals, wherein the sampler circuit outputs a plurality of second clock signals;
    a selector coupled to receive at least two of the plurality of second clock signals and a selection signal, wherein the selector outputs a divided clock signal; and
    a logic circuit coupled between the divider circuit and the selector to output the selection signal.

7. A method, comprising:
    outputting a plurality of clock signals, wherein each of the plurality of clock signals have the same period, and wherein at least two of the plurality of clock signals are out of phase;
    inputting the plurality of clock signals into a prescaler; and
    generating a divided clock signal having a higher frequency than the plurality of clock signals.

8. The method of claim 7, wherein the prescaler selectively outputs a first clock of the plurality of clock signals as the divided clock signal based on a second clock signal of the plurality of clock signals that was previously output from the prescaler.

9. The method of claim 8, wherein the first clock signal and the second clock signal are out of phase.

10. The method of claim 8, comprising selectively outputting from the prescaler the first clock signal according to a time delay from the output of the second clock signal.

11. The method of claim 10, comprising determining the time delay according to a sequential order of inputs of the plurality of clock signals into the prescaler.

12. The method of claim 7, wherein the generating step comprises:
    generating a reduced frequency signal from one of the plurality of clock signals;
    determining a control signal based on the reduced frequency signal;
    sampling the plurality of clock signals according to the control signal to output a plurality of sampled clock signals;
    generating a selection signal by logically processing the control signal; and
    outputting one of the sampled clock signals as the divided signal according to the selection signal.

13. The method of claim 7, wherein the generating comprises:
    generating a plurality of sampled clock signals from the plurality of clock signals;
    reducing a frequency of one of the plurality of clock signals; and
    selecting one of the sampled clock signals as the divided clock signal based on a control signal set according to the reduced frequency signal.

14. The method of claim 13, wherein a next selected sampled clock signal is based on a time delay from the selected one of the sampled clock signals.

15. An apparatus, comprising:
    an oscillator, wherein the oscillator comprises a plurality of delay cells configured to output a plurality of signals at the same frequency having different phases; and
    means for outputting a signal having a different frequency than the oscillator.

16. The apparatus of claim 15, comprising:
    means for generating a plurality of sampled clock signals from the plurality of signals;
    means for reducing a frequency of one of the plurality of signals; and
    means for selecting one of the sampled clock signals as the signal based on a control signal set according to the reduced frequency signal.

17. The apparatus of claim 16, wherein the means for outputting a signal having a different frequency than the oscillator comprises a multiplexer configured to:
    input the plurality of signals; and
    output one of the plurality of signals.

18. The apparatus of claim 15, wherein the means for outputting a signal having a different frequency than the oscillator comprises:
    a divider circuit coupled to receive one of the plurality of signals;
    a sampler circuit that receives an output signal of the divider circuit and the plurality of signals, wherein the sampler circuit outputs a plurality of first signals;
    a selector coupled to receive the plurality of first signals and a selection signal, wherein the selector outputs the signal having the different frequency; and
    a logic circuit coupled between the divider circuit and the selector to output the selection signal.

19. The apparatus of claim 18, wherein each of the plurality of signals have the same period and a different phase.

20. The apparatus of claim 18, wherein the selector selectively outputs a current one of the first signals as a divided clock signal based on a previous one of the plurality of first signals that was previously output from the selector.

21. The apparatus of claim 20, wherein the current one of the first signals and the previous one of the first signals are out of phase.

22. The apparatus of claim 20, wherein the selector selectively outputs the current one of the first signals according to a time delay from the output of the previous one of the first signals.

23. The apparatus of claim 22, wherein the time delay is determined according to a sequential order of inputs of the plurality of first signals into the selector.

* * * * *